US012796176B2

(12) United States Patent
Asada et al.

(10) Patent No.: US 12,796,176 B2
(45) Date of Patent: Nov. 10, 2026

(54) DISPLAY DEVICE, METHOD FOR MANUFACTURING DISPLAY DEVICE, AND METHOD FOR INSPECTING DISPLAY DEVICE

(71) Applicant: Japan Display Inc., Tokyo (JP)

(72) Inventors: Keisuke Asada, Tokyo (JP); Kazuyuki Yamada, Tokyo (JP); Kenichi Takemasa, Tokyo (JP); Daiki Isono, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 510 days.

(21) Appl. No.: 18/350,774

(22) Filed: Jul. 12, 2023

(65) Prior Publication Data

US 2024/0021757 A1 Jan. 18, 2024

(30) Foreign Application Priority Data

Jul. 14, 2022 (JP) ................................ 2022-113186

(51) Int. Cl.

*H10H 20/831* (2025.01)
*H10H 20/01* (2025.01)
*H10H 20/854* (2025.01)
*H10P 74/20* (2026.01)

(52) U.S. Cl.

CPC .......... *H10H 20/831* (2025.01); *H10H 20/01* (2025.01); *H10H 20/854* (2025.01); *H10P 74/203* (2026.01); *H10H 20/032* (2025.01)

(58) Field of Classification Search

None

See application file for complete search history.

(56) References Cited

U.S. PATENT DOCUMENTS

| | | | | |
|---|---|---|---|---|
| 2022/0045242 A1 | 2/2022 | Ikeda et al. | | |
| 2022/0102326 A1 | 3/2022 | Asada | | |
| 2022/0149254 A1* | 5/2022 | Schuele | .................. | H10P 95/11 |
| 2023/0007770 A1 | 1/2023 | Takemasa et al. | | |

FOREIGN PATENT DOCUMENTS

| | | |
|---|---|---|
| JP | 2021-004988 A | 1/2021 |
| JP | 2021-153114 A | 9/2021 |
| JP | 2022-029226 A | 2/2022 |

OTHER PUBLICATIONS

Yamada et al (WO2021/005902), LED module and display including LED module, Jan. 14, 2021 (Year: 2021).*

* cited by examiner

*Primary Examiner* — Alexander G Ghyka

(74) *Attorney, Agent, or Firm* — XSENSUS LLP

(57) ABSTRACT

A display device includes a substrate, a first electrode and a second electrode on the substrate, and an LED chip disposed on the first electrode and the second electrode and having an n-side pad electrode and a p-side pad electrode. The n-side pad electrode has a first protruding portion, the first protruding portion protruding toward the substrate and in contact with the first electrode, and the p-side pad electrode has a second protruding portion, the second protruding portion protruding toward the substrate and in contact with the second electrode.

4 Claims, 11 Drawing Sheets

DISPLAY DEVICE, METHOD FOR MANUFACTURING DISPLAY DEVICE, AND METHOD FOR INSPECTING DISPLAY DEVICE

CROSS-REFERENCE TO RELATED APPLICATION

This application claims the benefit of priority to Japanese Patent Application No. 2022-113186, filed on Jul. 14, 2022, the entire contents of which are incorporated herein by reference.

FIELD

An embodiment of the present invention relates to a display device in which light emitting diodes (LEDs) are arranged on a substrate, a method for manufacturing a display device, and method for inspecting a display device to check its quality.

BACKGROUND

A micro-LED display is known in which micro light-emitting diodes, called micro-LEDs, are mounted on pixels arranged in a matrix. The micro-LED display has a structure in which micro-LEDs individualized from a wafer, or the like, are mounted on a substrate on which circuits, called a backplane, are formed.

As a method of mounting a micro-LED on a substrate, it is disclosed that an anisotropic conductive film (ACF) is used to adhere an anode and cathode of the micro-LED to an anode pad and a cathode pad on the substrate. Also disclosed is a method of forming alignment marks by using aligned ACF and agglomerating the ACF. A method of connecting and fixing flip chip LEDs having a step between the anode and cathode to electrodes on a substrate by using bumps of different sizes is disclosed.

In recent years, a method of mounting flip-chip micro-LEDs on a substrate has been adopted in which the electrode on the micro-LED chip is in direct contact with the electrode on the substrate, and is fixed by heating and crimping in the presence of a resin such as NCF (Non Conductive Film). In this case, it is necessary to confirm that the electrical connection between the electrodes on the micro-LED side and the electrodes on the substrate side is sufficiently secured. One way to evaluate such a connection is to observe the indentation caused by the micro-LED electrodes being pressed into the substrate electrode. Therefore, the connection between the electrodes on the micro-LED side and the electrodes on the substrate side must be such that the indentation is clearly created.

SUMMARY

A display device in an embodiment according to the present invention includes a substrate, a first electrode and a second electrode on the substrate, and an LED chip disposed on the first electrode and the second electrode and having an n-side pad electrode and a p-side pad electrode. The n-side pad electrode has a first protruding portion, the first protruding portion protruding toward the substrate and in contact with the first electrode, and the p-side pad electrode has a second protruding portion, the second protruding portion protruding toward the substrate and in contact with the second electrode.

A method for manufacturing a display device in an embodiment according to the present invention includes pressing a first protruding portion which protrudes toward a substrate of an n-side pad electrode of an LED chip against a first electrode disposed on the substrate, and pressing a second protruding portion which protrudes toward the substrate of a p-side pad electrode of the LED chip against a second electrode disposed on the substrate.

A method for inspecting a display device in an embodiment according to the present invention includes observing indentations formed on a first electrode and a second electrode on a substrate after an LED chip having a n-side pad electrode with a first protruding portion and a p-side pad electrode with a second protruding portion is pressed against the first electrode and the second electrode on the substrate, respectively, and determining a state of electrical connection between the LED chip and the first electrode and the second electrode from a state of the indentations.

DESCRIPTION OF EMBODIMENTS

Hereinafter, embodiments of the present invention are described with reference to the drawings. However, the present invention can be implemented in many different aspects, and should not be construed as being limited to the description of the following embodiments. For the sake of clarifying the explanation, the drawings may be expressed schematically with respect to the width, thickness, shape, and the like of each part compared to the actual aspect, but this is only an example and does not limit the interpretation of the present invention. For this specification and each drawing, elements similar to those described previously with respect to previous drawings may be given the same reference sign (or a number followed by a, b, etc.) and a detailed description may be omitted as appropriate. The terms "first" and "second" appended to each element are a convenience sign used to distinguish them and have no further meaning except as otherwise explained.

As used herein, where a member or region is "on" (or "below") another member or region, this includes cases where it is not only directly on (or just under) the other member or region but also above (or below) the other member or region, unless otherwise specified. That is, it includes the case where another component is included in between above (or below) other members or regions. In the following description, unless otherwise noted, the direction in which the first and second electrodes are disposed with respect to the substrate in a cross-sectional view is referred to as "up", "upper", "top surface", or "top side", and vice versa as "down", "lower", "bottom surface", or "bottom side".

A structure of a display device according to an embodiment of the present invention will be described. In the following description, the structure of a connection part between an LED chip and electrodes disposed on the substrate will mainly be described.

(1) Structure of LED Chip

Figure 1A:
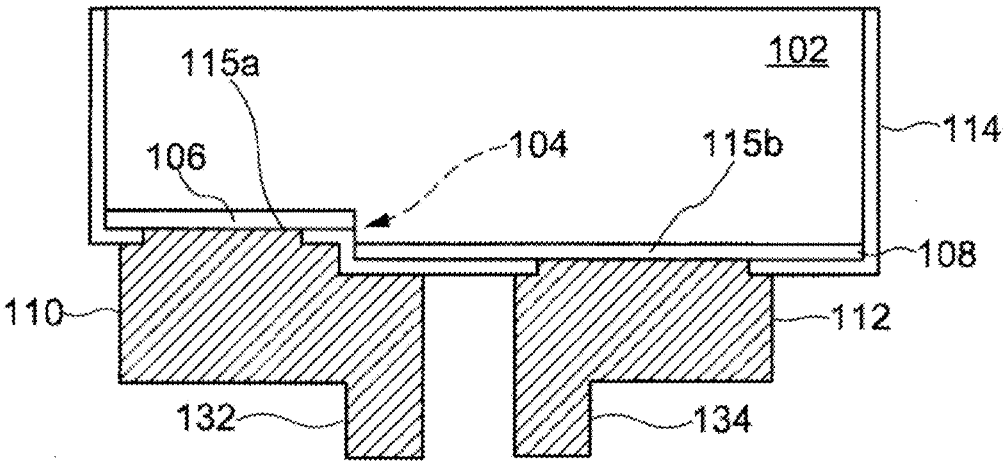
FIG. 1A is a configuration of an LED chip in a display according to an embodiment of the present invention.

FIG. 1A shows the structure of an LED chip 102 used in a display device according to an embodiment of the invention. The LED chip 102 is two-terminal device having a cathode electrode 106 and an anode electrode 108, and can be flip-chip mounted on a substrate. The LED chip 102 has an n-side pad electrode 110 and a p-side pad electrode 112 that are connected to electrodes on the substrate when mounted on the substrate.

Although not shown in detail in FIG. 1, the LED chip 102 has a stacked structure of an n-type semiconductor layer, an active layer, and a p-type semiconductor layer. A passivation film 114 may be arranged on a side surface of the LED chip 102 to prevent surface recombination. The passivation film 114 has a first opening 115*a* for electrically connecting the n-side pad electrode 110 to the cathode electrode 106 and a second opening 115*b* for electrically connecting the A-side pad electrode 112 to the anode electrode 108. The n-side pad electrode 110 is connected to the LED chip through the first opening 115*a*, and the p-side pad electrode 112 is connected to the LED chip through the second opening 115*b*.

The LED chip 102 is described using a micro-LED as an example, where the chip size is more than a few micrometers and less than 100 μm. However, an embodiment of the present invention can use LEDs of any size, and can be used according to the application and form of the display device.

As shown in FIG. 1A, the LED chip 102 has different heights between the opening 115*a* and opening 115*b*. This is because the cathode electrode 106 is located in an area where part of the semiconductor layer (p-type semiconductor layer, active layer) has been removed. When the LED chip 102 is mounted on the substrate 120, a thickness of the n-side pad electrode connecting to the first electrode 116 on the substrate 120 is slightly larger than the distance between the p-side pad electrode 112 connecting to the second electrode 118.

In order to make an area of the light-emitting region (area of the active layer) of the LED chip 102 as large as possible, an area forming the cathode electrode 106 is smaller than an area forming the anode electrode 108.

Figure 1B:
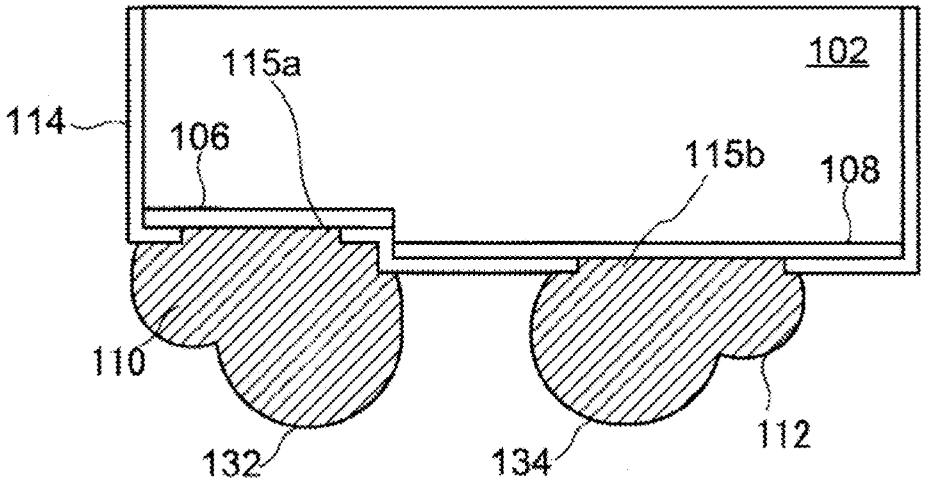
FIG. 1B is a configuration of an LED chip in a display according to an embodiment of the present invention.

The LED chip 102 may have a structure where the n-side pad electrode 110 is disposed beyond a step 104 of the LED chip 102 to embed the step 104, as shown in FIG. 1A and FIG. 1B.

The structures of the n-side pad electrode 110 and p-side pad electrode 112 are described in detail.

As shown in FIG. 1A, the n-side pad electrode 110 and the p-side pad electrode 112 are formed with protrusions. In this specification, the protruding portion formed on the n-side pad electrode 110 is called a first protruding portion 132 and the protruding portion formed on the p-side pad electrode 112 is called a second protruding portion 134.

FIG. 1B shows another aspect of the shape of the first protruding portion 132 and the second protruding portion 134, which have the shape of large and small spheres stacked on top of each other. Various shapes of these protruding portions can be applied, for example, an abbreviated rectangular shape as shown in FIG. 1A, a curved surface shape as shown in FIG. 1B, or a conical, pyramidal, or similar shape whose cross-sectional area becomes smaller the closer it is to the contact area with the substrate, a cylindrical shape, or other various structures can be used. These can be selected according to the hardness and electrical conductivity of the electrode on the substrate side.

Figure 2:
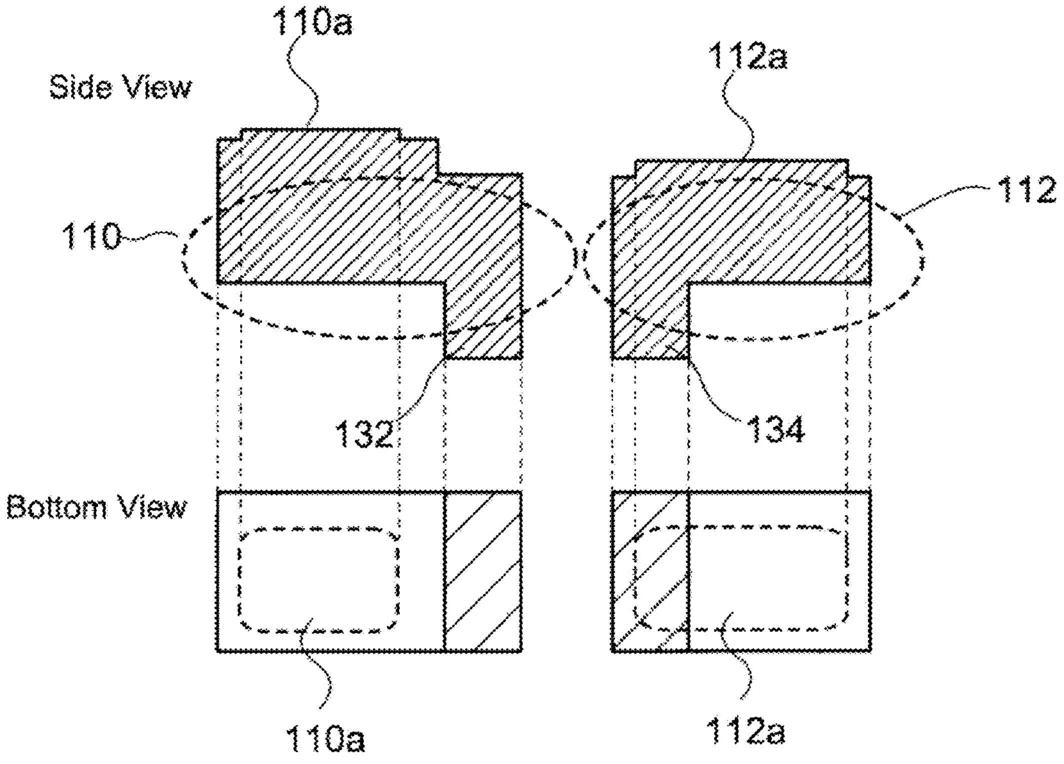
FIG. 2 is a side view and bottom view of an n-side pad electrode and a p-side pad electrode in FIG. 1A.

FIG. 2 is an enlarged view of the n-side pad electrode 110 and the p-side pad electrode 112 on the LED chip 102 shown in FIG. 1A. The upper side of FIG. 2 is a side view viewed from the same direction as FIG. 1A, and the lower side is a bottom view viewed from the substrate side.

In the following description, the n-side pad electrode 110 includes a body portion, the first protruding portion 132, and other portions that connect to the cathode electrode 106, and the p-side pad electrode 112 includes a body portion, the second protruding portion 134, and other portions that connect to the anode electrode 108. In other words, the first protruding portion 132 is a part in the n-side pad electrode 110 and the second protruding portion 134 is a part in the p-side pad electrode 112. The body portion and the first protruding portion 132 of the n-side pad electrode 110 and the body portion and the second protruding portion 134 of the p-side pad electrode 112 may be configured by one continuous member (material) or by combining different members (materials).

The upper portions 110*a* and 112*a* of the n-side pad electrode 110 and A-side pad electrode 112 in the side view shown in FIG. 2 are the portions that contact the cathode electrode 106 and anode electrode 108 at the openings 115*a* and 115*b* in the LED chip 102. These will be the areas 110*a* and 112*a* represented by dashed lines in the bottom view, and are shown to be rectangular in shape in the bottom view, but the shape is not limited to this. The shape of the contacting portions depends on the shape of the openings 115*a* and 115*b*, which may be circular, oval or any other shape.

The n-side pad electrode 110 has the first protruding portion 132 having a shape protruding downward (in the direction toward the substrate) in the side view, and this portion contacts the first electrode 116 on the substrate 120. Similarly, the p-side pad electrode 112 has the second protruding portion 134 having a downward (toward the substrate) shape in the side view, and this portion is in contact with the first electrode 116 on the substrate 120.

The contact surfaces of the first protruding portion 132 and the second protruding portion 134 with the electrode on the substrate side are rectangular, as shown in the shaded area in the bottom view in FIG. 2, but the contact surfaces can be circular, oval, or any other shape, for example.

The contact area of the first protruding portion 132 with the electrode on the substrate side in the bottom view should be sufficiently smaller than the maximum cross-sectional area of the n-side pad electrode 110, but it is more preferable that it is 70% or less of the maximum cross-sectional area of the n-side pad electrode 110. Similarly, the contact area of the second protruding portion 134 in the bottom view should be sufficiently smaller than the maximum cross-sectional area of the p-side pad electrode 112, but it is more preferable that it is 50% or less of the maximum cross-sectional area of the p-side pad electrode 112.

The maximum cross-sectional area of the pad electrode indicates the area of the outermost figure of each pad electrode in the bottom view, for example, the outermost rectangular cross-sectional area in the bottom view in FIG. 2.

The height of the first protruding portion 132 in a lateral view is preferably 10% or more and more preferably 25% or more of the height of the entire n-side pad electrode 110. Similarly, the height of the second protruding portion 134 in a lateral view is preferably 10% or more and more preferably 25% or more of the overall height of the n-side pad electrode 110.

The first protruding portion 132 and the second protruding portion 134 may be plural in the n-side pad electrode 110 and the p-side pad electrode, respectively. The number of first protruding portions 132 and second protruding portions 134 may not be the same.

The n-side pad electrode 110 and p-side pad electrode 112 can be made of known electrode materials. As an example, metallic materials such as aluminum (Al), gold (Au), silver (Ag), palladium (Pd), and indium (In), and low temperature softening materials such as solder and conductive paste can be used as electrode materials. The forming method of the n-side pad electrode 110 and the p-side pad electrode 112 is not particularly limited, and known plating methods and deposition methods such as sputtering can be used.

The first protruding portion 132 and the second protruding portion 134 can also be made of known electrode materials. As an example, metallic materials such as aluminum (Al), gold (Au), silver (Ag), palladium (Pd), and indium (In), or low temperature softening materials such as solder or conductive paste can be used as electrode materials. A known plating method or a known deposition method such as sputtering can be used to form the first protruding portion 132 and the second protruding portion 134.

The first protruding portion 132 may be configured of the same material as other areas of the n-side pad electrode 110 or of a different material. Similarly, the second protruding portion 134 may be configured of the same material as other areas of the p-side pad electrode 112 or of a different material. For example, only the first protruding portion 132 and the second protruding portion 134 may be configured with gold in the n-side pad electrode 110 and the p-side pad electrode 112, while the other regions may be configured with copper.

In the bottom view shown in FIG. 2, the contact portion 110*a* between the n-side pad electrode 110 and the cathode electrode 106 does not overlap in the region with the first protruding portion 132, in contrast, the contact portion 112*a* between the p-side pad electrode 112 and the anode electrode 108 overlaps the region with the second protruding portion 134. However, the contact portions of the n-side pad electrode 110 and the p-side pad electrode 112 with the substrate 120 side and the LED chip side are not limited in terms of their positional relationship in the bottom view.

As described below, the connection between the n-side pad electrode 110 and p-side pad electrode 112 on the LED chip 102 and the first electrode 116 and second electrode 118 is made by indenting the substrate 120 and the LED chip 102. In this case, the smaller the contact area between the first protruding portion 132 and the second protruding portion 134 and the electrodes on the substrate, the easier it is for an indentation to occur on the electrode on the substrate 120 side. When an indentation can be clearly confirmed during the quality evaluation described below, it can be determined that the electrical connection between the LED chip 102 and the substrate 120 is maintained.

(2) Formation of LED-Side Electrode

The process of forming the n-side pad electrode 110 and p-side pad electrode 112 on the LED chip 102 is described with reference to FIG. 3A to FIG. 3C and FIG. 4A to FIG. 4B. Here, when forming the n-side pad electrode 110 and A-side pad electrode 112 on the LED chip 102, each layer is formed with the substrate side face up in the LED chip 102, and therefore, in FIG. 3, the LED chip 102 shown in FIG. 1A is rotated 180 degrees.

As mentioned above, the LED chip 102 has a structure in which the n-type semiconductor layer, active layer, and p-type semiconductor layer (not shown in the figure) are stacked, and the active layer and p-type semiconductor layer are removed from the top surface of the n-type semiconductor layer, and the passivation film 114 is provided on the surface. In such a chip, the opening 115*a* for bonding the n-type semiconductor layer to the n-side pad electrode 110 and the opening 115*b* for bonding the p-type semiconductor layer to the p-side pad electrode 112 are formed to partially expose the cathode electrode 106 and anode electrode 108 on the LED chip 102, and the cathode electrode 106 and the anode electrode 108 are partially exposed on the LED chip 102.

Figure 3A:
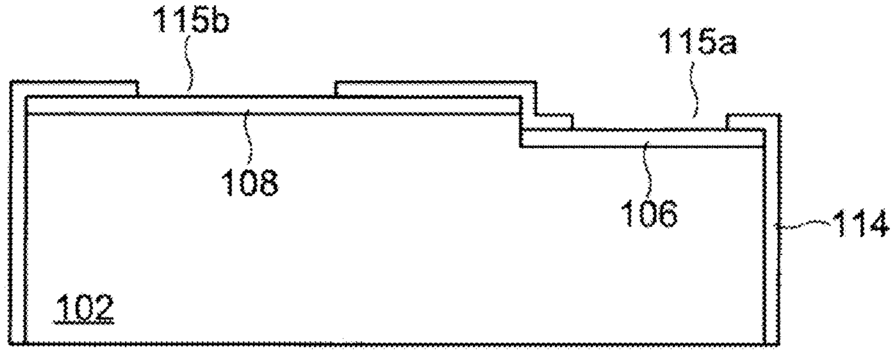
FIG. 3A is a manufacturing process of an n-side pad electrode and a p-side pad electrode in a display device according to an embodiment of the present invention.
Figure 3B:
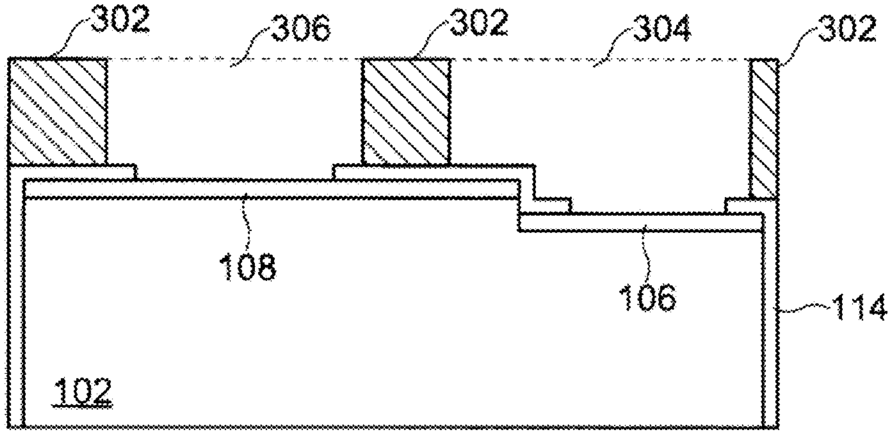
FIG. 3B is a manufacturing process of an n-side pad electrode and a p-side pad electrode in a display device according to an embodiment of the present invention.

FIG. 3B shows a first resist mask 302 formed on the substrate side surface of the LED chip 102. The first resist mask 302 has a thickness of about 1 μm, for example, and is formed by a so-called thick film resist. The first resist mask 302 has a first opening 304 corresponding to the cathode electrode 106 and a second opening 306 corresponding to the anode electrode 108.

Figure 3C:
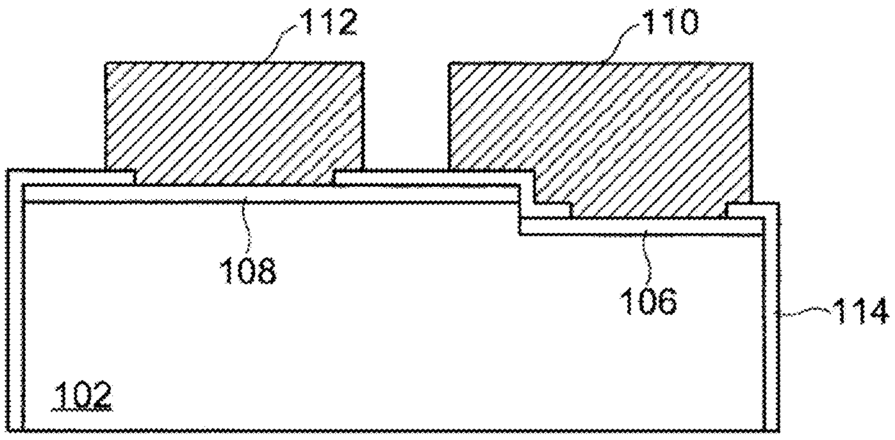
FIG. 3C is a manufacturing process of an n-side pad electrode and a p-side pad electrode in a display device according to an embodiment of the present invention.

FIG. 3C shows the step where the base layer of the n-side pad electrode 110 and the p-side pad electrode 112 (other than the first protruding portion 132 and the second protruding portion 134) are formed. The base layer of the n-side pad electrode 110 and the p-side pad electrode 112 is formed by a plating method using conductive materials such as gold and copper. After the base layers of the n-side pad electrode 110 and the p-side pad electrode 112 are formed, the first resist mask 302 is removed.

Figure 4A:
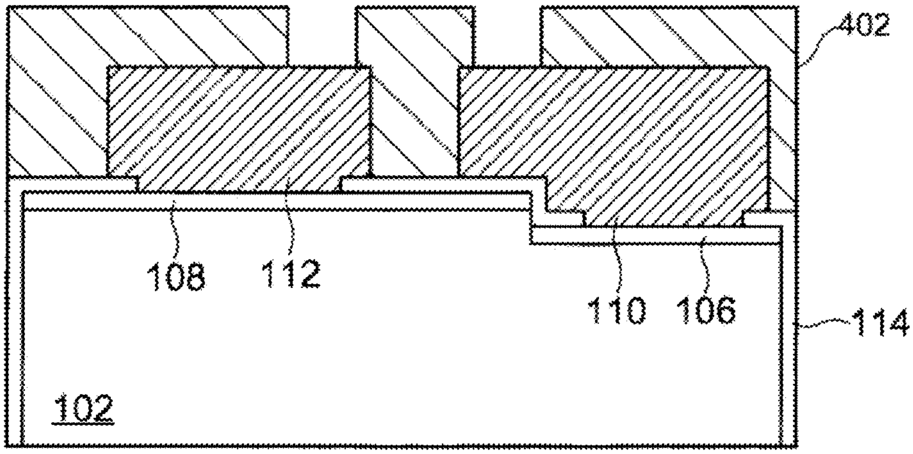
FIG. 4A is a manufacturing process of an n-side pad electrode and a p-side pad electrode in a display device according to an embodiment of the present invention.

FIG. 4A shows a second resist mask 402 formed to form the first protruding portion 132 and the second protruding portion 134 protruding from the underlying layer of the n-side pad electrode 110 and the p-side pad electrode 112 formed in FIG. 3C.

Figure 4B:
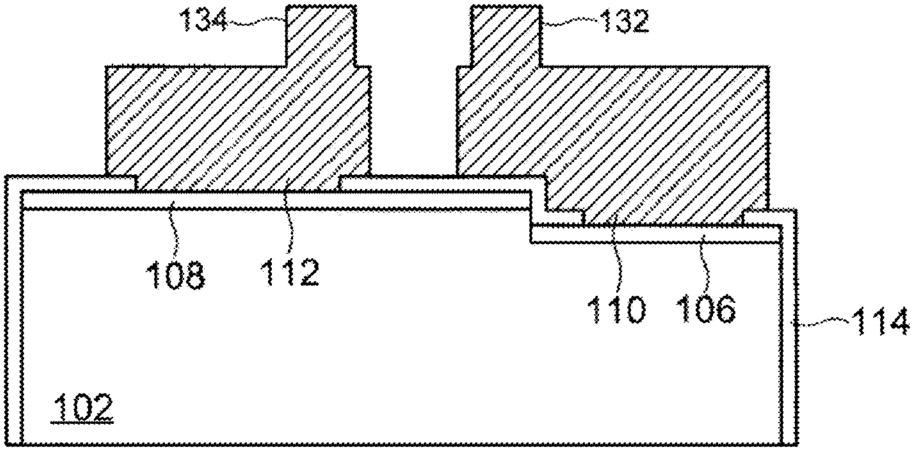
FIG. 4B is a manufacturing process of an n-side pad electrode and a p-side pad electrode in a display device according to an embodiment of the present invention.

FIG. 4B shows the formation of the first protruding portion 132 and the second protruding portion 134 having a protruding shape on the n-side pad electrode 110 and the p-side pad electrode 112. The first protruding portion 132 and the second protruding portion 134 protruding on the base layer of the n-side pad electrode 110 and the p-side pad electrode 112 are formed by plating gold, copper, or other conductive materials by the plating method as well as the base layer. After the first protruding portion 132 and the second protruding portion 134 are formed, the second resist mask 402 is removed.

Figure 5A:
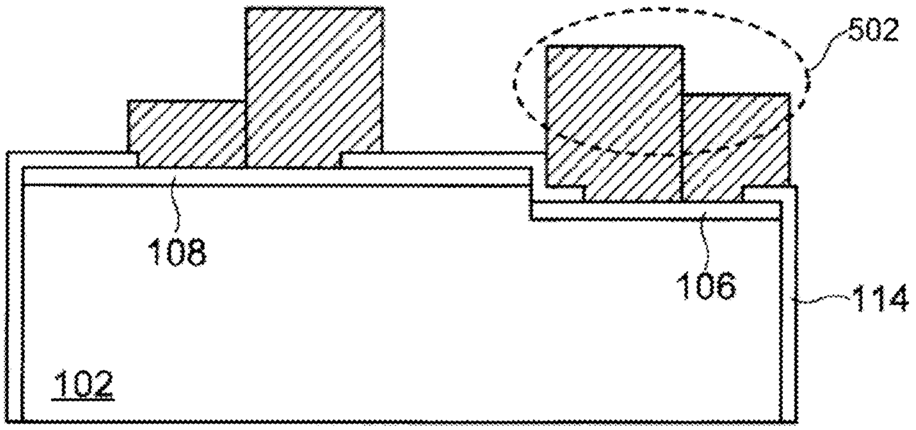
FIG. 5A is a manufacturing process of an n-side pad electrode and a p-side pad electrode in a display device according to an embodiment of the present invention.
Figure 5B:
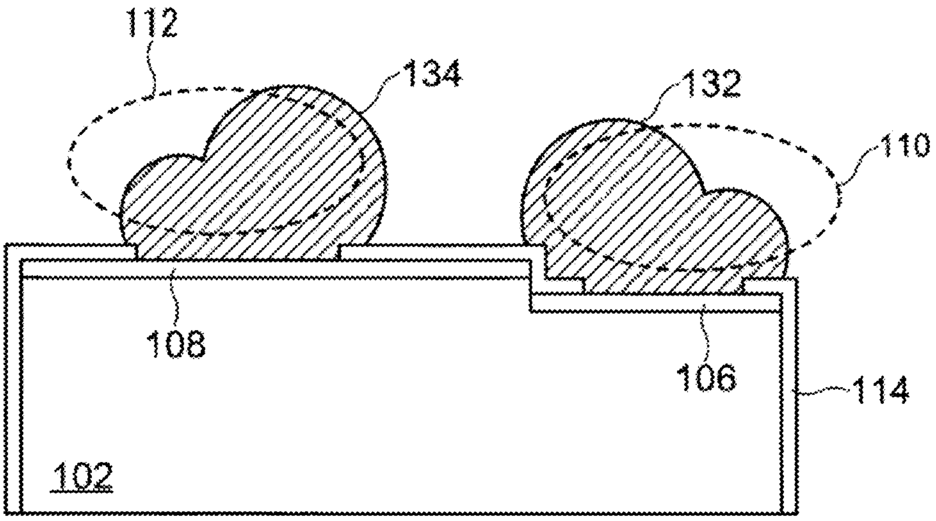
FIG. 5B is a manufacturing process of an n-side pad electrode and a p-side pad electrode in a display device according to an embodiment of the present invention.

FIG. 5A and FIG. 5B illustrate another process for forming the n-side pad electrode 110 and the p-side pad electrode 112 on the LED chip 102.

FIG. 5A shows an example of forming the n-side pad electrode 110 and the p-side pad electrode 112 with a contact portion having a protruding shape by overlapping bumps of different sizes formed by materials with low melting points, such as solder.

FIG. 5A and FIG. 5B are similar to FIGS. 3 and 4, where the first and second resist masks are used to form solder layers 502 with different heights and close proximity (FIG. 5A). Here, the solder layers are fluidized and integrated by a heat treatment. The solder layer then changes shape to form bumps, as if the solder layers were overlapping spherical surfaces (FIG. 5B). When these bumps are cooled and solidified, the first protruding portion 132 and the second protruding portion 134 with a protruding shape are formed to function as the n-side pad electrode 110 and the p-side pad electrode 112, respectively, and to contact the first electrode 116 and the second electrode 118 on the 120 side of the substrate, respectively.

(3) Mounting Structure of LED Chip

Figure 6A:
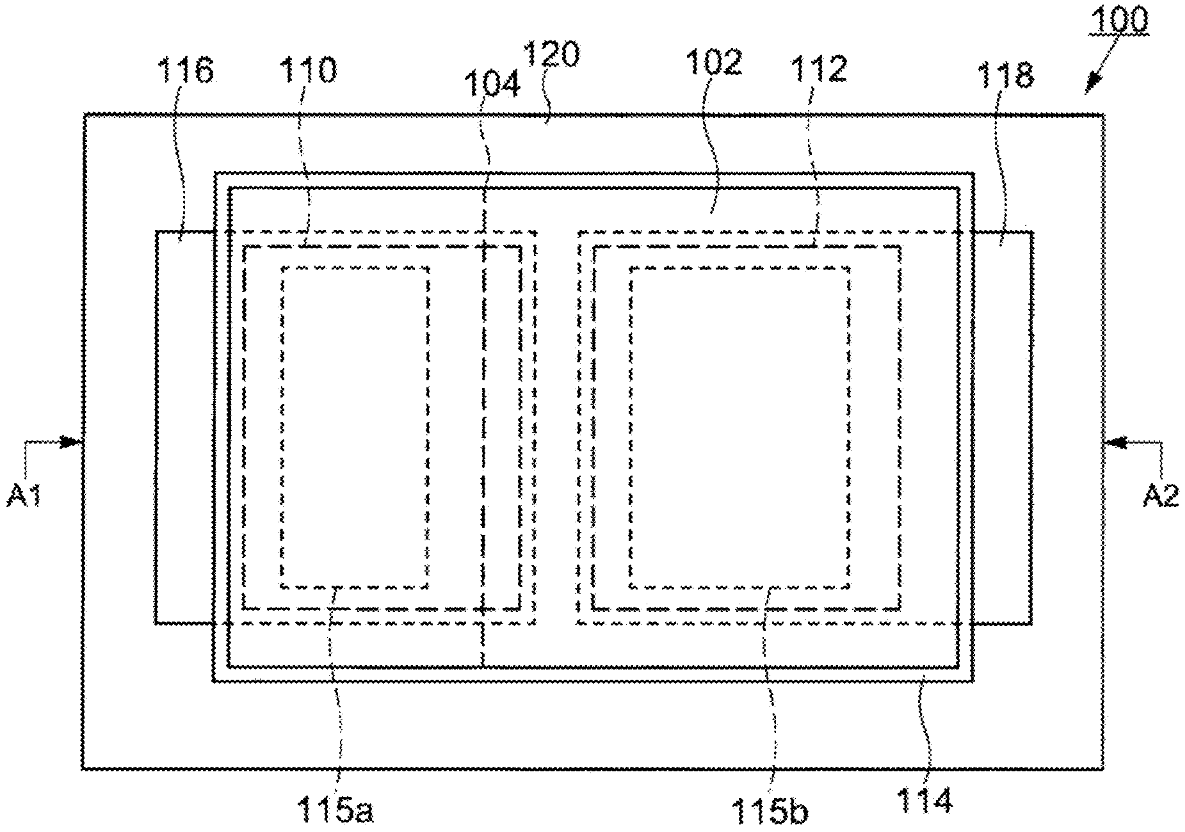
FIG. 6A is a top view of a display device according to an embodiment of the present invention.
Figure 6B:
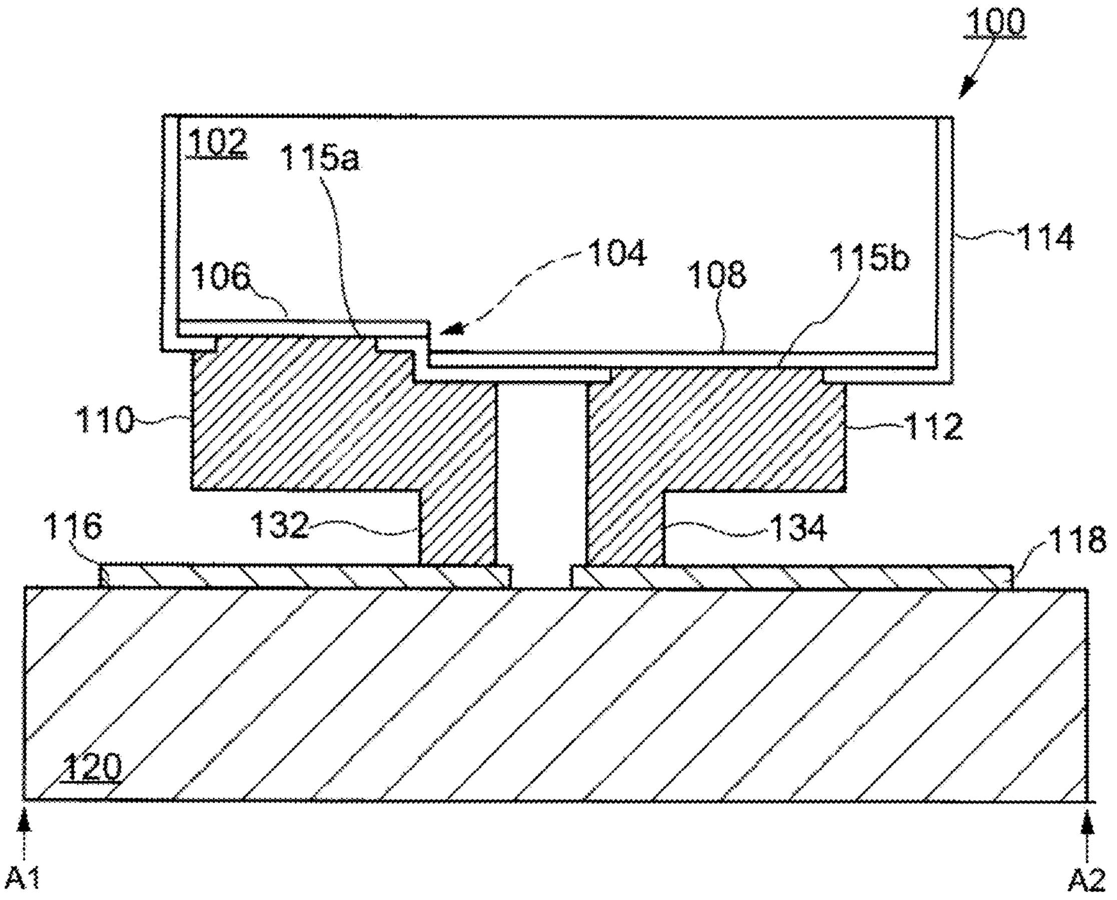
FIG. 6B is a side view of a display device according to an embodiment of the present invention.

FIGS. 6A and 6B show the configuration of the LED module 100 of the display device. FIG. 6A shows a top view of the LED module 100 mounted on the substrate 120. FIG. 6B shows a cross-sectional view between A1-A2 shown in FIG. 6A. The substrate 120 is disposed with the first electrode 116 and the second electrode 118 corresponding to the n-side pad electrode 110 and the p-side pad electrode 112 of the LED chip 102.

The n-side pad electrode 110 and the p-side pad electrode 112 are connected to the first electrode 116 and the second electrode 118 on the substrate 120 to mount the LED chip 102. At this time, the thickness of the n-side pad electrode 110 and p-side pad electrode 112 is adjusted so that the substrate 120 and LED chip 102 are in a horizontal position.

As mentioned above, the surface of the substrate 120 side of the n-side pad electrode 110 has the first protruding portion 132 formed with one portion protruding toward the substrate, and this first protruding portion 132 is in contact with the first electrode 116 on the substrate 120 side. Similarly, the surface on the substrate 120 side of the p-side pad electrode 112 has the second protruding portion 134 formed with one portion protruding toward the substrate, and the second protruding portion 134 is in contact with the second electrode 118 on the substrate 120 side. It is possible to reduce the area of the portion where the electrodes are in contact with each other by having the n-side pad electrode 110 and the p-side pad electrode 112 contact the electrode on the substrate side in such a form.

The substrate 120 on which the LED chip 102 is mounted must be observed from the back side to observe the contact state of the electrodes, as described below. Therefore, it is preferable to use a material with good light transmittance for the substrate, for example, a substrate configured with glass, quartz, or sapphire can be used.

(4) Manufacturing of Display Devices

Figure 7:
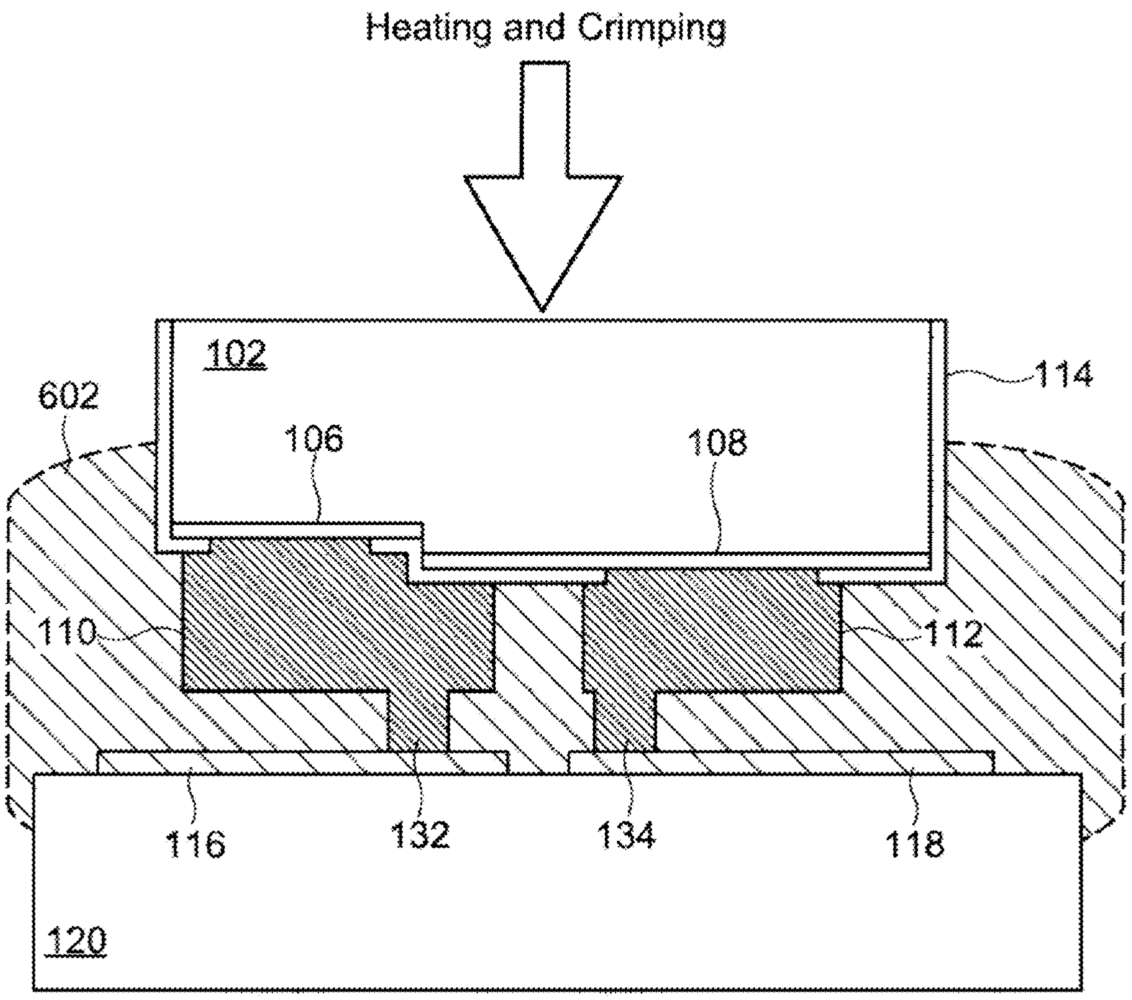
FIG. 7 is a diagram illustrating the process of crimping an LED chip and a substrate in a display device according to an embodiment of the present invention.

FIG. 7 shows the process of mounting the LED chip 102 to the substrate 120. The protruding portion 132 of the n-side pad electrode 110 is brought into contact with the first electrode 116 on the substrate, and the protruding portion 134 of the A-side pad electrode 112 is brought into contact with the second electrode 118 on the substrate. Here, the space between the LED chip 102 and the substrate 120 is filled with a resin 602 such as NCF.

For example, a film of NCF or similar material is cut and scattered over the top surface of the substrate, and these are heated to near their melting temperature. Once the NCF is heated and softened, the LED chip is placed from the arrow direction shown in FIG. 7, heated, and pressed toward the substrate 120, and then the NCF solidifies to complete the bonding of the LED chip 102 and the substrate 120. At that time, the first protruding portion 132 and the second protruding portion 134 of the LED chip 102 have a small contact area with the electrode on the substrate, so the aforementioned crimping will locally press into the surface of the first electrode 116 and the second electrode 118 on the substrate 120, leaving an indentation.

The NCF used for adhering the LED chip 102 to the substrate 120 can be, for example, a polyimide thermosetting adhesive film or an adhesive using epoxy or acrylic resin. In addition to NCF, conductive adhesives, anisotropic conductive films (ACF), and other known adhesive materials can be used to adhere the LED chip 102 to the substrate 120. However, when a conductive adhesive or anisotropic conductive film is used instead of NCF, the adhesive should be conductive only in the areas where the first protruding portion 132 and the first electrode 116 and the second protruding portion 134 and the second electrode 118 are connected, so that the first electrode 116 and the second electrode 118 do not short, and the conductive particles of the ACF are assumed to be present to prevent shorts.

(5) Inspection of Indentations

As described above, the electrical connection between the LED chip 102 and the substrate 120 is made by pressing the n-side pad electrode 110 with the first protruding portion 132 and the p-side pad electrode 112 with the second protruding portion 134 on the LED chip 102 side against the first electrode 116 and the second electrode 118 on the substrate 120 side and then hardening the resin such as NCF by curing using NCF. In this process, electrical conductivity between the substrate 120 and the LED chip 102 is ensured by the first protruding portion 132 and the second protruding portion 134 on the LED chip 102 side being sufficiently pressed against the electrodes on the substrate side. Therefore, when manufacturing the display device, a process is required to inspect whether or not the above electrodes are sufficiently press-fitted.

To confirm that the electrodes are sufficiently pressed together, the indentation marks made by the first protruding portion 132 and the second protruding portion 134 on the LED chip 102 side on the substrate-side first electrode 116 and second electrode 118 when they are pressed to the substrate are observed. It is possible to evaluate that the electrical conductivity between the LED chip 102 and the substrate 120 is good if these indentation marks can be clearly observed.

The indentation can be confirmed by observing the unevenness on the first electrode 116 and the second electrode 118 on the substrate 120 from the back side of the substrate 120. In other words, this is done by transmitting light from the back side of the substrate 120, observing using a microscope such as a differential interference microscope, capturing images of the indentations visible under the microscope through an imaging device, and checking the image data. Therefore, at least between the substrate 120 and the first electrode 116 and the second electrode 118, there should be no light-shielding metallic material other than the first electrode 116 and the second electrode 118 in the area overlapping the first protruding portion 132 and the second protruding portion 134.

Figure 8:
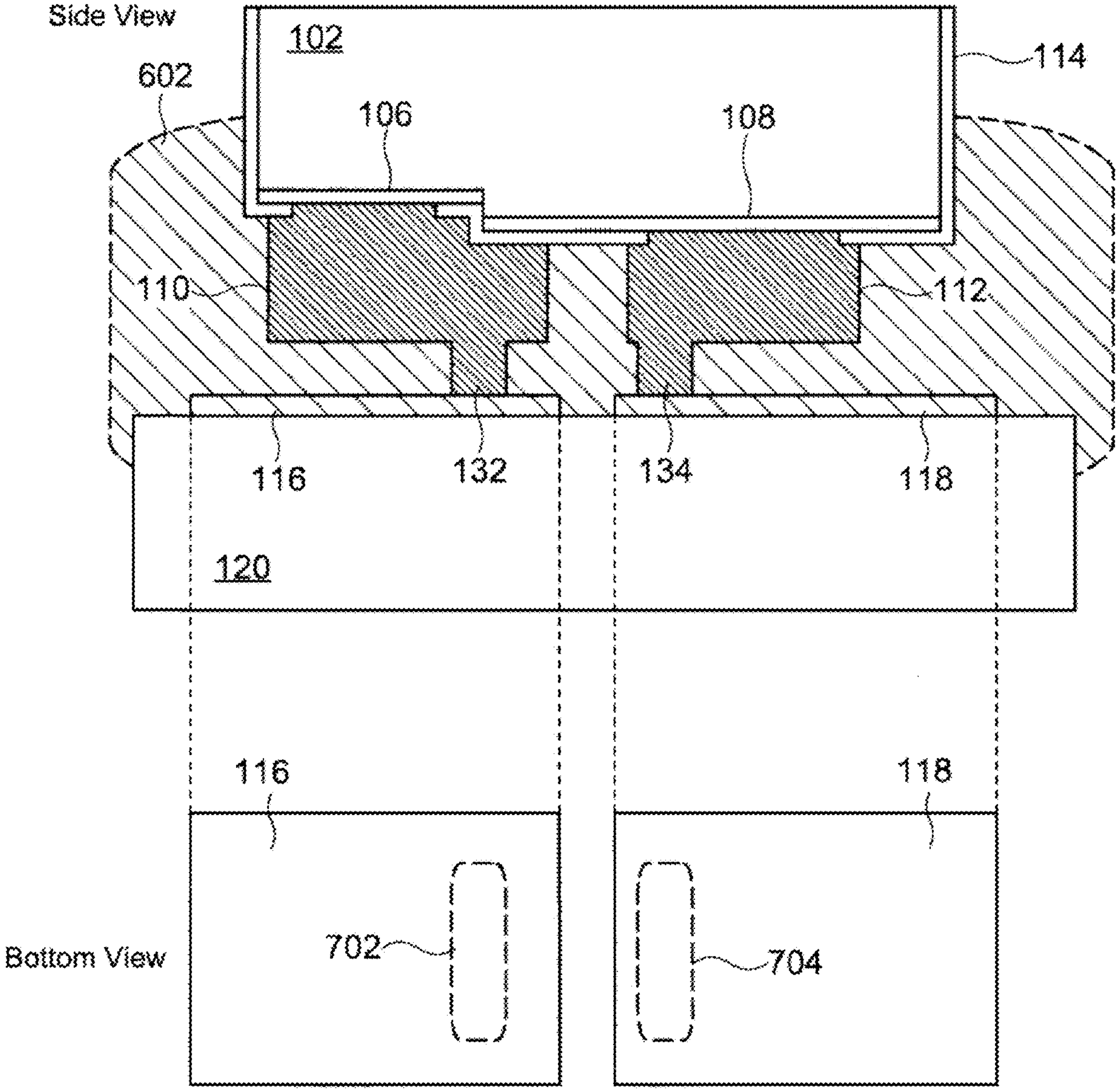
FIG. 8 is a diagram illustrating an inspection method for a display device according to an embodiment of the present invention.

FIG. 8 is a schematic diagram of the indentation observed from the backside of the substrate in contrast to the crimping process diagram of the LED chip 102 and the substrate 120 in FIG. 7. In FIG. 8, the area of the first electrode 116 and the second electrode 118 on the substrate 120 is sufficiently larger than the contact area of the first protruding portion 132 and second protruding portion 134 on the LED chip 102, therefore, the force applied when crimping is concentrated on the contact surface of the LED chip 102. Then, the indentations shown by dashed lines in the bottom view are observed (reference letters 702 and 704 in the bottom view of FIG. 8).

The indentation is not limited to the form mentioned above. For example, when ACF is used to bond the LED chip 102 to the substrate 120, the unevenness on the grains created when the conductive particles in the ACF are squeezed is observed on the electrode, resulting in a different form of indentation than when NCF is used.

The evaluation of electrical continuity between the LED chip 102 and substrate 120 may be done by visual judgment by an inspector, alternatively, the shape of the indentation and the electrical continuity between the LED chip 102 and the substrate 120 may be evaluated using AI (Artificial Intelligence) that has been trained on the shape of the indentation and the electrical continuity between the LED chip 102 and the substrate 120.

(6) Display Device

The configuration of a display device according to an embodiment of the present invention is shown below. The display device of the present embodiment has a structure in which an LED chip is provided in a pixel. The pixel has a structure in which the LED chip is connected to the first electrode 116 and the second electrode 118 formed on the circuit board by the n-side pad electrode 110 and the p-side pad electrode 112 on the LED chip, as shown in FIG. 6B. In other words, the display device shown in the present embodiment has a structure in which the LED chip is mounted with the structure shown in FIG. 6B.

Figure 9:
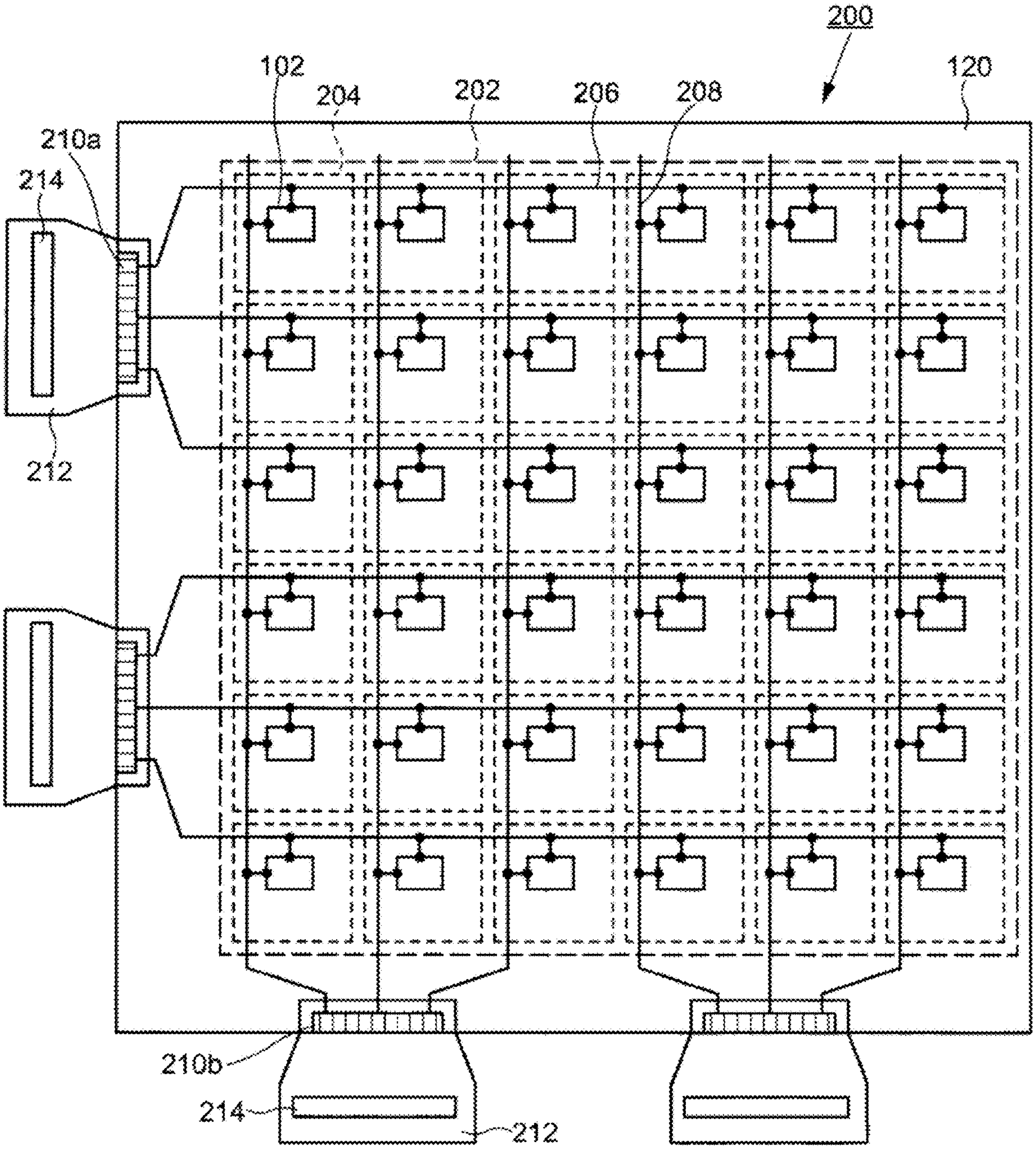
FIG. 9 is a configuration of a display device according to an embodiment of the present invention.

FIG. 9 shows a configuration of a display device 200. The display device 200 has a display part 202 with a plurality of pixels 204 arranged in a matrix on a substrate 120. The LED chips 102 are mounted in the pixels 204. Each pixel may have different LED chips 102 with different wavelengths of emitted light mounted as appropriate. For example, the plurality of pixels 204 may include a pixel mounted with an LED chip emitting red light, a pixel mounted with an LED chip emitting green light, and a pixel mounted with an LED chip emitting blue light as appropriate. An LED chip emitting white light may be mounted in each pixel as a color filter type display device, or an LED chip emitting blue or ultraviolet light may be mounted in each pixel as a quantum dot display device.

The display part 202 is arranged with scanning signal lines 206 for inputting scanning signals to the pixels 204 and data signal lines 208 for inputting video signals. The scanning signal lines 206 and data signal lines 208 are arranged to intersect. An input terminal part 210*a* for the scanning signal lines 206 and an input terminal part 210*b* for the data signal lines 208 are arranged on the periphery of the substrate 120. The input terminal parts 210*a* and 210*b* are connected to a flexible printed wiring substrate 212. A driver IC 214 may be mounted on the flexible printed wiring substrate 212.

Figure 10:
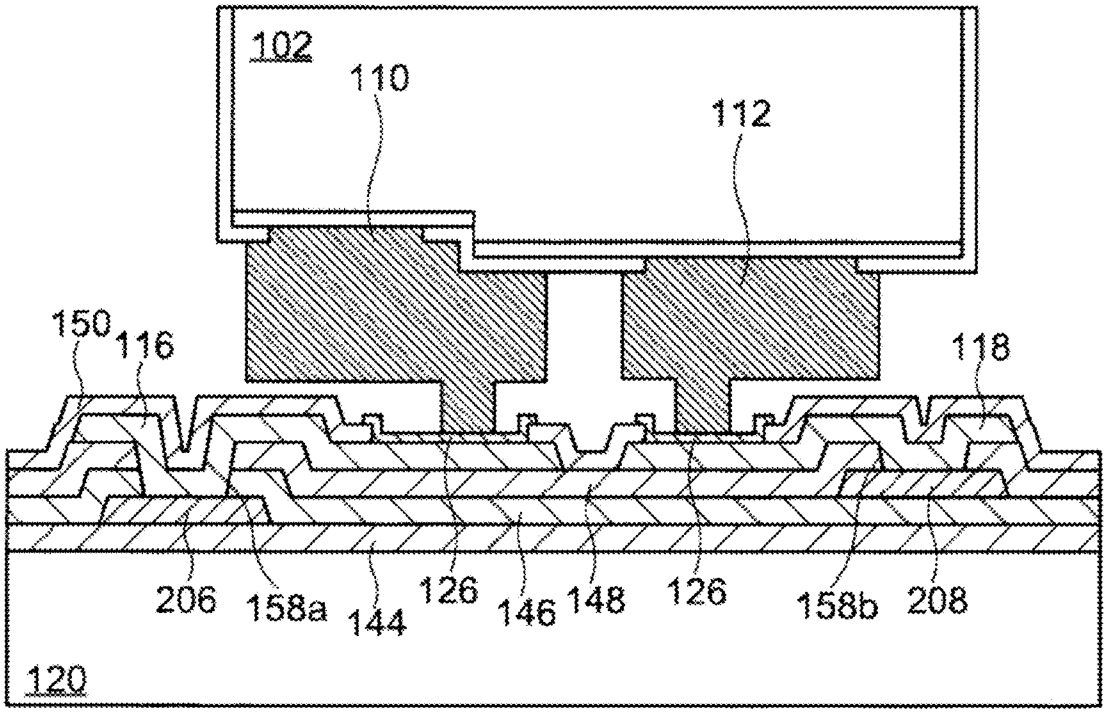
FIG. 10 is a cross-sectional view of a pixel of a display device according to an embodiment of the present invention.

FIG. 10 shows an example of the cross-sectional structure of pixel 204. The pixel 204 has a structure in which a first insulating layer 144, a second insulating layer 146, a third insulating layer 148, and a fourth insulating layer 150 are stacked, with the scanning signal lines 206 between the first insulating layer 144 and the second insulating layer 146 and the data signal lines 208 between the second insulating layer 146 and the third insulating layer 148.

The first electrode 116 and the second electrode 118 are disposed on the third insulating layer 148. The first electrode 116 is electrically connected to the scanning signal line 206 through the second insulating layer 146 and also the first contact hole 158*a* through the second insulating layer 146, and the second electrode 118 is electrically connected to the data signal line 208 through the second contact hole 158*b* through the third insulating layer 148. The fourth insulating layer 150 is disposed on the upper layer side of the first electrode 116 and the second electrode 118. The first electrode 116 and the second electrode 118 are exposed by openings formed in the fourth insulating layer 150 at the positions where they are to be in contact with the n-side pad electrode 110 and the p-side pad electrode 112 on the LED chip 102 side.

The LED chip 102 is disposed on the first electrode 116 and the second electrode 118. The LED chip 102 is electrically connected to the first electrode 116 via the protruding portion 132 of the n-side pad electrode 110 and to the second electrode 118 via the protruding portion 134 of the p-side pad electrode 112. A base metal film 126 may be deposited between the first protruding portion and the first electrode 116 and between the second protruding portion and the second electrode 118.

As shown in FIG. 10, the thickness of the n-side pad electrode 110 and A-side pad electrode 112 can be adjusted to mount the LED chip 102 horizontally on the first electrode 116 and the second electrode 118.

FIG. 10 shows an example of a passive matrix display device 200, but this embodiment is not limited to this, and can also be applied to an active matrix display device in which the light emission of individual pixels is controlled by a pixel circuit with transistors.

The structure of the pixel, which can be designed and changed as appropriate by a person skilled in the art based on the pixel structure of the display device described above as one embodiment of the invention, also belongs to the technical scope of the invention as long as it encompasses the gist of the invention.

Within the scope of the idea of the invention, a person skilled in the art can conceive of various examples of changes and modifications, and these changes and modifications also fall within the technical scope of the invention. For example, in one embodiment of the invention described above, any addition, deletion, or modification made by a person skilled in the art, as well as any addition or omission of a process or any modification of conditions, belongs to the technical scope of the invention, as long as it does not depart from the gist of the invention.

It is understood that the advantageous effects brought about by the aspects described in one embodiment of the invention, which are obvious from the description herein and which may be conceived by a person skilled in the art from time to time, are naturally brought about by the invention.

What is claimed is:

1. A display device, comprising:

a substrate;

a first electrode and a second electrode on the substrate; and an LED chip disposed on the first electrode and the second electrode and having an n-side pad electrode and a p-side pad electrode, wherein:

the n-side pad electrode has a first protruding portion, the first protruding portion protruding toward the substrate and in contact with the first electrode, the p-side pad electrode has a second protruding portion, the second protruding portion protruding toward the substrate and in contact with the second electrode, and the first electrode includes a first indentation formed by the first protruding portion, and the second electrode includes a second indentation formed by the second protruding portion.

2. The display device according to claim 1, wherein a height of the first protruding portion is 25% or more of a height of the n-side pad electrode, and a height of the second protruding portion is 25% or more of a height of the p-side pad electrode.

3. The display device according to claim 1, wherein a contact area between the first protruding portion and the first electrode is 50% or less of an entire area of the n-side pad electrode in a plan view, and a contact area between the second protruding portion and the second electrode is 50% or less of an entire area of the p-side pad electrode in a plan view.

4. The display device according to claim 1, wherein the substrate and the LED chip are bonded by a resin while maintaining an electrical connection.

* * * * *